(12) United States Patent
Jo et al.

(10) Patent No.: US 12,328,977 B2
(45) Date of Patent: Jun. 10, 2025

(54) LIGHT EMITTING DEVICE PAKAGE

(71) Applicant: LUMENS CO., LTD., Yongin-si (KR)

(72) Inventors: Sung Sik Jo, Yongin-si (KR); Pyeong Guk Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 465 days.

(21) Appl. No.: 17/746,877

(22) Filed: May 17, 2022

(65) Prior Publication Data

US 2022/0393069 A1 Dec. 8, 2022

(30) Foreign Application Priority Data

Jun. 2, 2021 (KR) .................. 10-2021-0071417
Sep. 3, 2021 (KR) .................. 10-2021-0117582

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/8142* (2025.01); *H10H 20/851* (2025.01); *H10H 20/857* (2025.01)

(58) Field of Classification Search
CPC ............. H01L 33/10; H01L 33/36–405; H01L 33/44–46; H01L 33/58–60; H01L 33/48–508; H10K 50/856; H10K 59/122; H10K 59/173; H10H 20/852–854; H10H 29/852–854
See application file for complete search history.

(56) References Cited

U.S. PATENT DOCUMENTS 8,502,251 B2 * 8/2013 Oberleitner ........... H01L 33/505
257/433
2011/0012153 A1 1/2011 Kim
(Continued)

FOREIGN PATENT DOCUMENTS

CN 102185089 B * 9/2015 ........... H01L 33/483
EP 2613370 A2 10/2013
(Continued)

OTHER PUBLICATIONS

European Search Report dated Oct. 24, 2022, issued by European Patent Office in European Patent Application No. 22175114.

*Primary Examiner* — Amar Movva
*Assistant Examiner* — Eric Manuel Mulero Flores
(74) *Attorney, Agent, or Firm* — Mei & Mark LLP

(57) ABSTRACT

A light-emitting device package includes a frame including one side on which a first electrode is formed and the other side on which a second electrode is formed, an LED chip including a first conductive connection pad electrically connected to the first electrode and a second conductive connection pad electrically connected to the second electrode, a reflective member disposed on the frame, forming a cavity for accommodating the LED chip therein, and reflecting light emitted from the LED chip, and a wavelength conversion member filled in the cavity to cover the LED chip, wherein the reflective member includes a first side and a second side different from the first side, and a first height of the first side and a second height of the second side are formed to be different from each other.

8 Claims, 11 Drawing Sheets

(51) Int. Cl.
*H10H 20/814* (2025.01)
*H10H 20/851* (2025.01)
*H10H 20/857* (2025.01)

(56) References Cited

U.S. PATENT DOCUMENTS

2012/0134178 A1* 5/2012 Park .................... H01L 33/486
  362/609
2017/0104141 A1  4/2017 Park et al.
2021/0066552 A1* 3/2021 Kim .................... H10H 20/856

FOREIGN PATENT DOCUMENTS

TW      M361724 U  *  7/2009
TW      201208129 A  *  2/2012

* cited by examiner (A)　　　　　　　　　　　　(B)

LIGHT EMITTING DEVICE PAKAGE

CROSS-REFERENCE TO RELATED APPLICATION

This application is based on and claims priority under 35 U.S.C. § 119 to Korean Patent Application No. 10-2021-0071417, filed on Jun. 2, 2021 and No. 10-2021-0117582, filed on Sep. 3, 2021 in the Korean Intellectual Property Office, the disclosure of which is incorporated by reference herein in its entirety.

BACKGROUND

1. Field

An embodiment of the present disclosure relates to a light-emitting device package, and more particularly, to a light-emitting device package that may be used for display or lighting purposes.

2. Description of the Related Art

A light-emitting diode (LED) refers to a type of semiconductor device capable of realizing light of various colors by forming a light-emitting source by forming a PN diode of a compound semiconductor. Such a light-emitting device has a long lifespan, may be miniaturized and lightweight, and may be driven at a low voltage. In addition, these LEDs are strong against shock and vibration, do not require warm-up time and complicated driving, and may be packaged after being mounted on a substrate or lead frame in various forms, so they may be modularized for various purposes and applied to a back light unit or various lighting apparatuses, etc.

On the other hand, in conventional light-emitting device packages applied to edge-type backlight units, which are an isotropic light-emitting type, color shading may occur between the light-emitting device packages because a directivity angle is narrow. In addition, in order to solve such the color shading, when intervals of light-emitting device packages are reduced by increasing the number of light-emitting device packages as before, costs are increased.

SUMMARY

An objective of the embodiments of the present disclosure for solving the above problems is to provide a light-emitting device package capable of increasing a directivity angle and increasing light efficiency by exposing a side surface of a wavelength conversion member.

Additional aspects will be set forth in part in the description which follows and, in part, will be apparent from the description, or may be learned by practice of the presented embodiments of the disclosure.

One embodiment of the present disclosure provides a light-emitting device package including a frame including one side on which a first electrode is formed and the other side on which a second electrode is formed, an LED chip including a first conductive connection pad electrically connected to the first electrode and a second conductive connection pad electrically connected to the second electrode, a reflective member disposed on the frame, forming a cavity for accommodating the LED chip therein, and reflecting light emitted from the LED chip, and a wavelength conversion member filled in the cavity to cover the LED chip, wherein the reflective member includes a first side and a second side different from the first side, and a first height of the first side and a second height of the second side are formed to be different from each other.

In one embodiment of the present disclosure, the first side may be made of a pair of sides facing each other among four sides of the reflective member, and the second side may be made of the remaining pair of sides among the four sides of the reflective member.

In one embodiment of the present disclosure, the second side may include an open area having the second height less than the first height of the first side.

In one embodiment of the present disclosure, an inner surface of the open area may have a stepped structure of two or more steps.

In one embodiment of the present disclosure, a portion of the inner surface of the open area may be formed of a curved surface.

In one embodiment of the present disclosure, the curved surface of the open area may have a parabolic shape profile concave toward an inside of the reflective member.

In one embodiment of the present disclosure, an imaginary extension surface extending from an upper surface of the LED chip may pass through a first area of the open area including the curved surface.

In one embodiment of the present disclosure, the second height may be equal to or less than half of the first height.

In one embodiment of the present disclosure, a length of the first side of the reflective member may be greater than a length of the second side thereof.

In one embodiment of the present disclosure, an inner surface of the first side may be made of an inclined surface having a constant inclination.

Another embodiment of the present disclosure provides a light-emitting device package including a frame including one side on which a first electrode is formed and the other side on which a second electrode is formed, an LED chip including a substrate having an upper surface, a semiconductor laminate structure formed under the substrate, and a wavelength conversion member covering at least the upper surface of the substrate, wherein a first conductive connection pad electrically connected to the first electrode and a second conductive connection pad electrically connected to the second electrode are formed under the semiconductor laminate structure, a reflective member disposed on the frame, forming a cavity for accommodating the LED chip therein, and reflecting light emitted from the LED chip, and a light-transmitting member filled in the cavity to cover the LED chip, wherein the reflective member includes a first side and a second side different from the first side, and a first height of the first side is different from a second height of the second side.

In one embodiment of the present disclosure, the first side may be made of a pair of sides facing each other among four sides of the reflective member, and the second side may be made of the remaining pair of sides among the four sides of the reflective member.

In one embodiment of the present disclosure, the second side may include an open area having the second height less than the first height of the first side.

In one embodiment of the present disclosure, an inner surface of the open area may have a stepped structure of two or more steps.

In one embodiment of the present disclosure, a portion of the inner surface of the open area may be formed of a curved surface.

In one embodiment of the present disclosure, the curved surface of the open area may have a parabolic shape profile concave toward an inside of the reflective member.

In one embodiment of the present disclosure, an imaginary extension surface extending from an upper surface of the LED chip may pass through a first area of the open area including the curved surface.

In one embodiment of the present disclosure, the second height may be equal to or less than half of the first height.

In one embodiment of the present disclosure, a length of the first side of the reflective member may be greater than a length of the second side thereof.

In one embodiment of the present disclosure, an inner surface of the first side may be made of an inclined surface having a constant inclination.

Other side surfaces, features and advantages other than those described above will become apparent from the following detailed description of the drawings, claims and disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
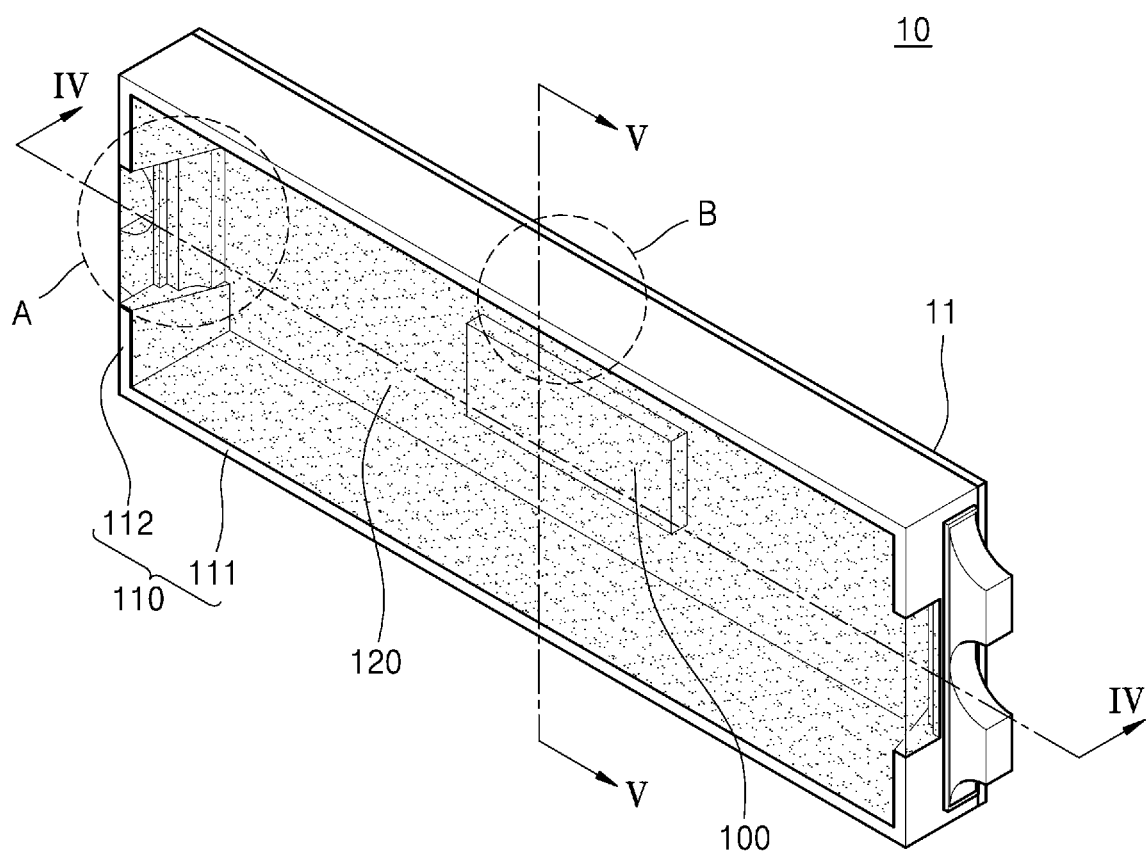
FIG. 1 is a view schematically illustrating a light-emitting device package according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, the following embodiments will be described in detail with reference to the accompanying drawings, and when described with reference to the drawings, the same or corresponding components are given the same reference numerals, and the overlapping description thereof will be omitted.

Since the present embodiments can apply various transformations, specific embodiments are illustrated in the drawings and described in detail in the detailed description. Effects and features of the present embodiments, and a method of achieving them will become clear with reference to the details described later in conjunction with the drawings. However, the present embodiments are not limited to the embodiments disclosed below and may be implemented in various forms.

In the following embodiments, terms such as first, second, etc. are used for the purpose of distinguishing one component from other components without limiting meaning.

In the following examples, the singular expression includes the plural expression unless the context clearly dictates otherwise.

In the following embodiments, terms such as include or have means that the features or components described in the specification are present, and the possibility that one or more other features or components will be added is not excluded in advance.

In the following embodiments, when it is said that a part such as a unit, region, or component is on or on another part, it is not only when it is directly on the other part, but also another unit, region, component, etc. is interposed therebetween. cases are included.

In the following embodiments, terms such as connect or couple do not necessarily mean direct and/or fixed connection or coupling of two members unless the context clearly indicates otherwise, and does not exclude that another member is interposed between the two members.

It means that a feature or element described in the specification is present, and does not preclude the possibility that one or more other features or elements may be added.

In the drawings, the size of the components may be exaggerated or reduced for convenience of description. For example, since the size and thickness of each component shown in the drawings are arbitrarily indicated for convenience of description, the following embodiment is not necessarily limited to the illustrated bar.

Figure 2:
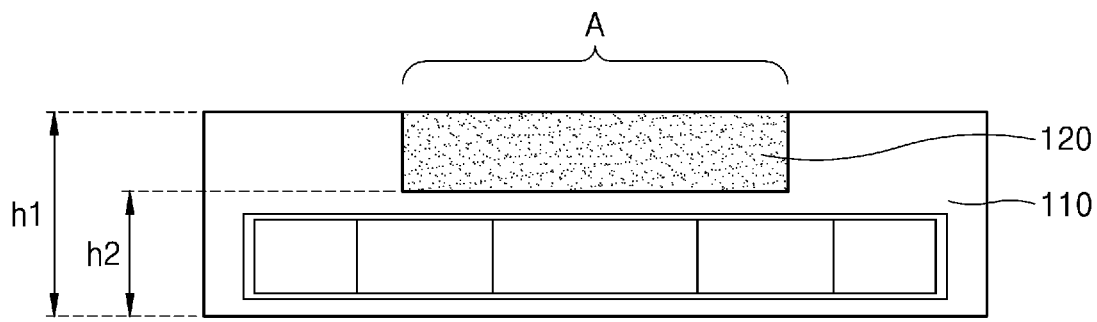
FIG. 2 is a side surface view of the light-emitting device package of FIG. 1.
Figure 3:
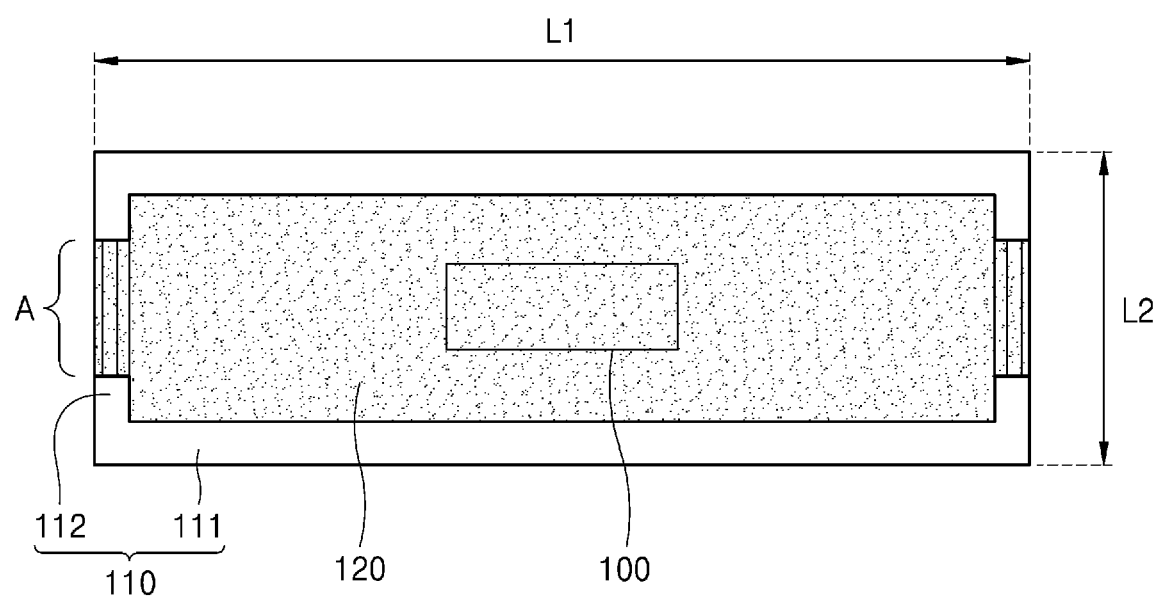
FIG. 3 is a plan view of the light-emitting device package of FIG. 1.
Figure 4:
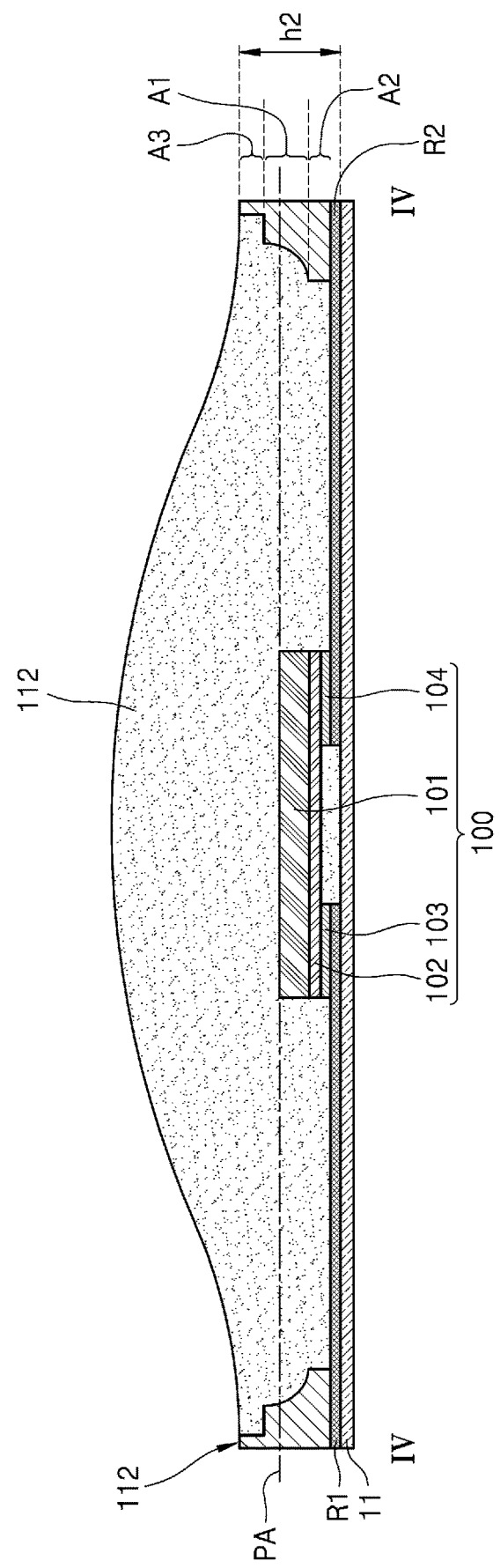
FIG. 4 is a cross-sectional view taken along line IV-IV of FIG. 1.
Figure 5:
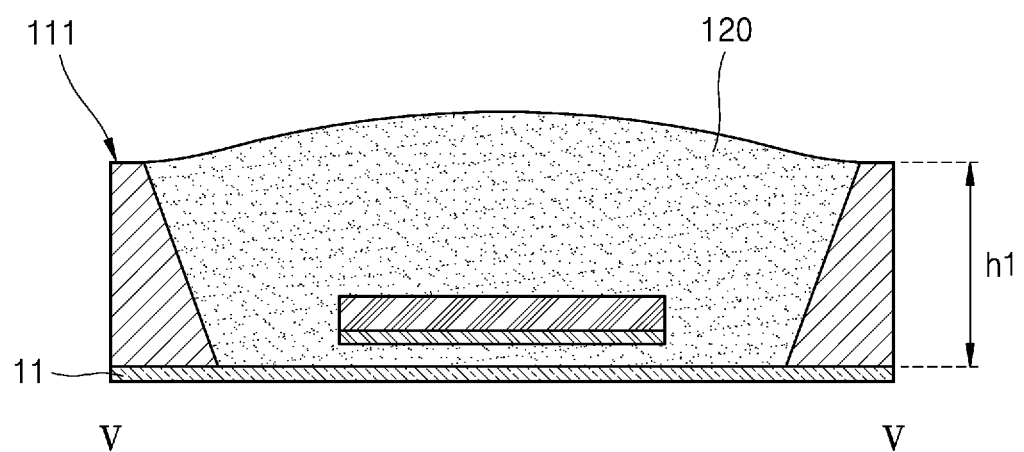
FIG. 5 is a cross-sectional view taken along line V-V of FIG. 1.
Figure 6:
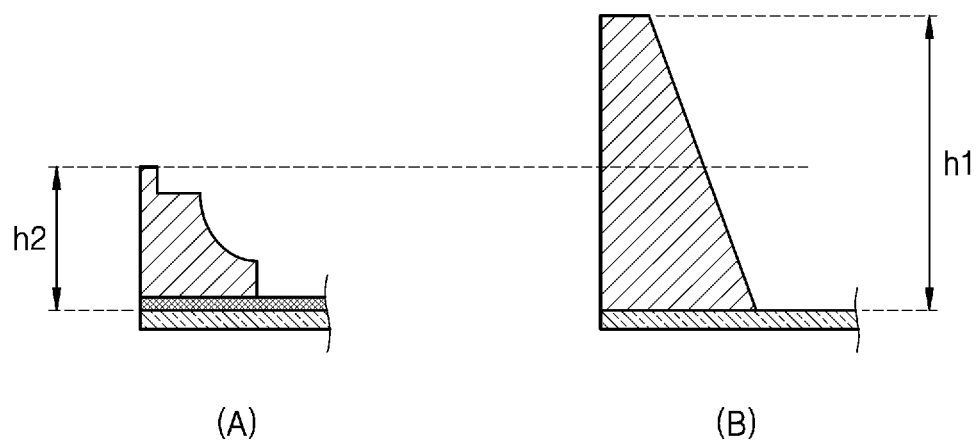
FIG. 6 is a view for comparing part A and part B of FIG. 1.

FIG. 1 is a view schematically illustrating a light-emitting device package 10 according to an embodiment of the present disclosure, FIG. 2 is a side surface view of the light-emitting device package 10 of FIG. 1, and FIG. 3 is a plan view of the light-emitting device package 10 of FIG. 1. FIG. 4 is a cross-sectional view taken along line IV-IV of FIG. 1, FIG. 5 is a cross-sectional view taken along line V-V of FIG. 1, and FIG. 6 is a view for comparing part A and part B of FIG. 1.

Referring to FIGS. 1 to 6, a light-emitting device package 10 according to an embodiment of the present disclosure may include a frame 11, an LED chip 100, a reflective member 110 and a wavelength conversion member 120.

The frame 11 may include one side on which a first electrode R1 is formed and the other side on which a second electrode R2 is formed. The first electrode R1 and the second electrode R2 may be formed symmetrically with respect to an electrode separation line. The frame 11 is electrically connected to the LED chip 100 by the first electrode R1 and the second electrode R2, and may be made of a material having adequate mechanical strength to support the LED chip 100.

Although the figure illustrates a case in which one LED chip 100 including a pair of first electrode R1 and second electrode R2 is mounted, the present disclosure is not limited thereto, and a plurality of LED chips 100 including a plurality of first electrodes R1 and second electrodes R2 may be mounted.

A metal substrate formed in a plate form or lead frame form with aluminum, copper, zinc, tin, lead, gold, silver, etc. may be applied to the frame 11. Alternatively, a printed circuit board (PCB) on which a wiring layer is formed or a flexible printed circuit board (FPCB) formed of a flexible material may be applied to the frame 11.

Alternatively, the frame 11 may be partially formed of a synthetic resin such as resin or glass epoxy or a ceramic material in consideration of thermal conductivity while being formed of metal, and may be formed of a material made of at least any one of epoxy mold compound (EMC), polyimide (PI), graphene, synthetic glass fiber, and combinations thereof in order to improve processability.

The LED chip 100 may include a substrate 101, a semiconductor laminate structure 102, a first conductive connection pad 103 and a second conductive connection pad 104.

The substrate 101 may be a sapphire substrate having a light-emitting surface.

The semiconductor laminate structure 102 may be a gallium nitride-based semiconductor laminate structure formed on the substrate 101. The semiconductor laminate structure 102 includes a first conductive semiconductor layer, an active layer, and a second conductive semiconductor layer. At this time, although illustrated briefly in the drawings, parts of the second conductive semiconductor layer and the active layer are selectively removed, so that a part of the first conductive semiconductor layer is exposed, and the first conductive connection pad 103 may be connected through an exposed region. Also, the second conductive connection pad 104 is connected to the second conductive semiconductor layer.

The first conductive connection pad 103 may be electrically connected to the first electrode R1, and the second conductive connection pad 104 may be electrically connected to the second electrode R2.

The LED chip 100 may be any one of a blue LED, a red LED and a green LED, and may be an LED that generates light of various wavelengths or an ultraviolet LED. However, the present disclosure is not limited thereto, and any of various horizontal or vertical LEDs or various types of light-emitting devices on which signal transmission media such as bumps, wires or solders are installed may be applied.

The reflective member 110 is disposed on the frame 11, forms a cavity accommodating the LED chip 100 therein, and may reflect light emitted from the LED chip 100. The reflective member 110 may be formed to surround a side surface of the LED chip 100, and may be made of a reflective material that reflects light emitted from the LED chip 100. In another embodiment, the reflective member 110 may be formed of an absorbing material that absorbs light emitted from the LED chip 100. Hereinafter, for convenience of description, a case in which the reflective member 110 is made of the reflective material will be mainly described.

The reflective member 110 may be a structure made of a molding resin material in which a reflective cup part having an open top to accommodate the LED chip 100 is formed. A base material of the reflective member 110 may be an organic or inorganic resin material. For example, the reflective member 110 may contain an organic or inorganic resin material such as silicone, epoxy, heat-resistant resin polyimide, phenol resin, melamine resin, unsaturated polyester resin, tritan, and the like.

The reflective member 110 may contain a light reflective material such as titanium oxide, silicon dioxide, titanium dioxide, zirconium dioxide, potassium titanate, alumina, aluminum nitride, boron nitride, mullite, chromium, white-based or metal-based substance, etc. in these resins. In addition, the reflective member 110 may further include boron nitride (BN), aluminum nitride (AlN), aluminum (Al), graphite, and the like. Through this, the reflective member 110 may improve heat dissipation performance.

The reflective member 110 includes a first side 111 having a first height h1 and a second side 112 having a second height h2, and the second height h2 may be less than the first height h1. The reflective member 110 may expose the wavelength conversion member 120 to be described later through the second side 112 formed at a lower level than the first side 111. Through this, the light-emitting device package 10 of the present disclosure may radiate light emitted from the LED chip 100 to an upper portion of the LED chip 100, and may also radiate light laterally through the second side 112 having the different height.

The first side 111 may be formed of a pair of sides facing each other among four sides of the reflective member 110, and the second side 112 may be formed of the remaining pair of sides among the four sides of the reflective member 110. For example, when the light-emitting device package 10 has a structure in which a length L1 in one direction is greater than a length L2 in the other direction as illustrated in the drawing, the first side 111 may be a pair of sides arranged in a long axis direction, and the second side 112 may be a pair of sides arranged in a short axis direction.

An inner surface of the first side 111 may be formed as an inclined surface with constant inclination. The first side 111 may reflect the light emitted from the LED chip 100 to the upper portion of the LED chip 100 through this inclination.

The total height of the second side 112 does not need to be less than the height of the first side 111, and as illustrated in the drawing, a predetermined area of the second side 112 may be less than the height of the first side 111 to form an open area A. In other words, the second side 112 may have the open area A having the second height h2 less than the first height h1 of the first side 111.

In this case, the second height h2 may be equal to or less than half of the first height h1. When the open area A is viewed from a side surface of the light-emitting device package 10, a central portion of the second side 112 may be formed in a concave groove structure (see FIG. 2).

An inner surface of the open area A may be formed of a stepped structure of two or more steps. As an embodiment, a portion of the inner surface of the open area A may have a three-step structure including a curved surface. The open area A may effectively reflect the light emitted from the LED chip 100 in a lateral direction through the structure at least partially formed of the curved surface.

Specifically, the open area A of the second side 112 may include a first area A1 having the curved surface, and a second area A2 and a third area A3 connected to both sides of the first area A1. The first area A1 may have the curved surface as described above, and the curved surface may have a parabolic shape profile concave toward an inside of the reflective member 110.

The first area A1 may be disposed on the second area A2 having a predetermined height. Through this, the first area A1 having the curved surface is arranged at a position corresponding to the LED chip 100 having a certain thickness, and an imaginary extension surface PA extending from an upper surface of the LED chip 100 may pass through the first area A1 of the open area A having the curved surface. Through this structure, the open area A may effectively reflect the light emitted from the LED chip 100 in the lateral direction as well.

The third area A3 may be disposed on the first area A1, and may be formed in a stepped structure having a predetermined height. The wavelength conversion member 120 to be described later is a material filled and accommodated in the cavity of the reflective member 110, and has initial fluidity. The third area A3 may be formed as the stepped structure to prevent the wavelength conversion member 120 having this fluidity from overflowing from the second side 112 that is at a lower level than the first side 111 in height.

The wavelength conversion member 120 may be filled inside the cavity to cover the LED chip 100. The wavelength conversion member 120 may be formed by a mixture of at least one phosphor and, for example, an encapsulant made of a resin powder. As an embodiment, when the LED chip 100 is a blue LED chip, the wavelength conversion member 120 may include red phosphor excited by blue light to emit red light and green phosphor emitting green light, or may include a yellow phosphor excited by blue light to emit yellow light.

If the side heights of the reflective member 110 are the same, the wavelength conversion member 120 may be formed to have an almost flat surface when filled in the cavity of the reflective member 110. However, in the present disclosure, since the height of the second side 112 of the reflective member 110 is less than the height of the first side 111, the wavelength conversion member 120 may have an externally convex curved surface rather than the flat surface. Accordingly, a height of an uppermost end of the wavelength conversion member 120 may be formed to be greater than a height of an uppermost end of the reflective member 110.

Figure 7:
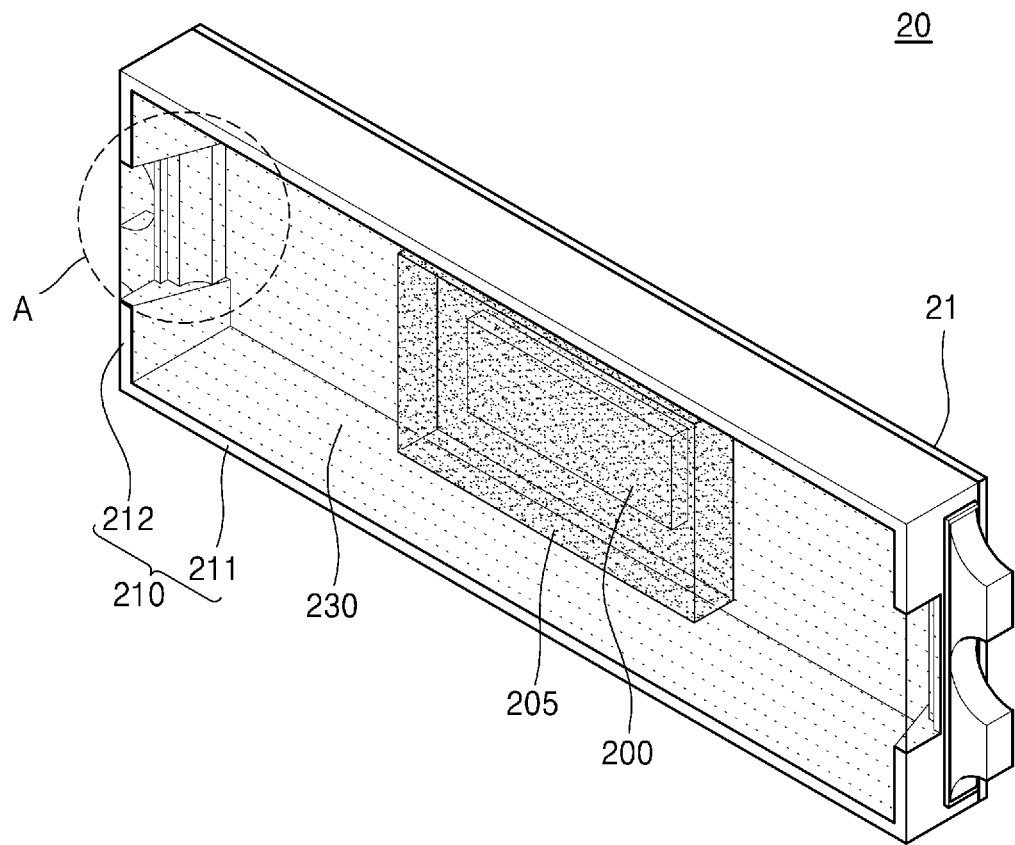
FIG. 7 is a diagram schematically illustrating a light-emitting device package according to another embodiment of the present disclosure.
Figure 8:
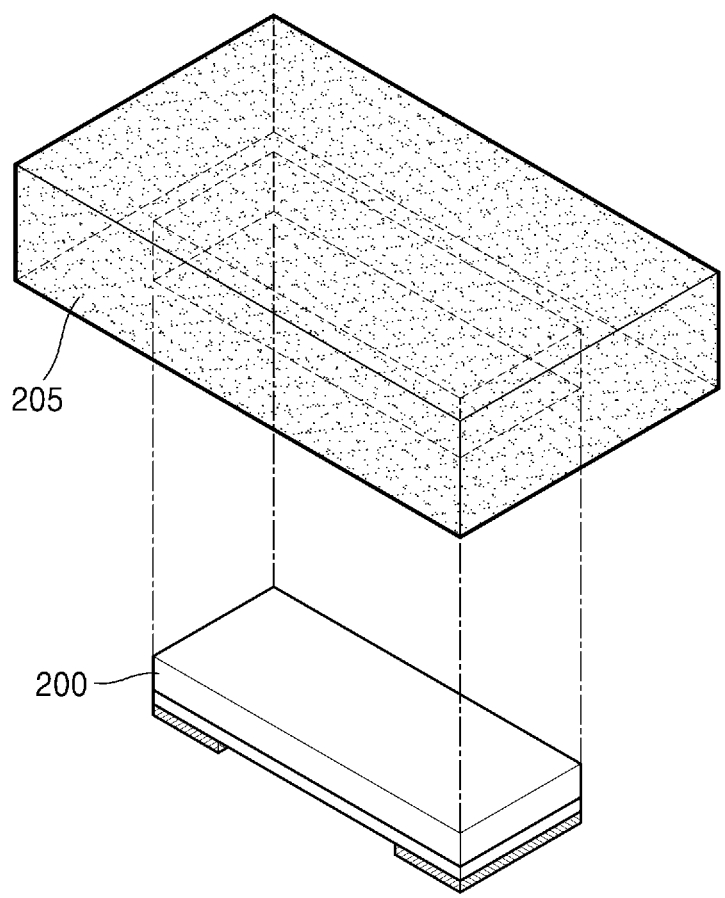
FIG. 8 is a view for explaining an LED chip according to another embodiment.

FIG. 7 is a diagram schematically illustrating a light-emitting device package 20 according to another embodiment of the present disclosure, and FIG. 8 is a view for explaining an LED chip 200 according to another embodiment.

Referring to FIGS. 7 and 8, a light-emitting device package 20 according to another embodiment of the present disclosure may include a frame 21, an LED chip 200, a reflective member 210 and a light-transmitting member 230.

The light-emitting device package 20 according to another embodiment is formed in a chip size package (CSP) structure in which the LED chip 200 includes a wavelength conversion member 205 including phosphor.

The frame 21 may include one side on which a first electrode (not illustrated) is formed and the other side on which a second electrode (not illustrated) is formed. The first electrode (not illustrated) and the second electrode (not illustrated) may be formed symmetrically with respect to an electrode separation line. The frame 21 is electrically connected to the LED chip 200 by the first electrode (not illustrated) and the second electrode (not illustrated), and may be made of a material having adequate mechanical strength to support the LED chip 200.

The LED chip 200 may include a substrate, a semiconductor laminate structure, a first conductive connection pad, a second conductive connection pad and the wavelength conversion member 205.

The substrate may be a sapphire substrate including a light-emitting surface.

The semiconductor laminate structure may be a gallium nitride-based semiconductor laminate structure formed on the substrate. The semiconductor laminate structure includes a first conductive semiconductor layer, an active layer, and a second conductive semiconductor layer. At this time, although illustrated briefly in the drawings, parts of the second conductive semiconductor layer and the active layer are selectively removed, so that a part of the first conductive semiconductor layer is exposed, and the first conductive connection pad may be connected through an exposed region. Also, the second conductive connection pad is connected to the second conductive semiconductor layer.

The first conductive connection pad may be electrically connected to the first electrode, and the second conductive connection pad may be electrically connected to the second electrode.

The wavelength conversion member 205 may cover at least the upper surface of the substrate. The wavelength conversion member 205 may be formed by a mixture of at least one phosphor and, for example, an encapsulant made of a resin powder. As an embodiment, when the LED chip 200 is a blue LED chip, the wavelength conversion member 205 may include red phosphor excited by blue light to emit red light and green phosphor emitting green light, or may include a yellow phosphor excited by blue light to emit yellow light.

A molding method for forming the wavelength conversion member 205 may be adopted in various ways. In particular, a transfer molding method in which resin powder and phosphor are mixed, softened at high temperature and high pressure to form a gel or liquefied, and press-fitted into a cavity of a heated mold to form a tablet may be advantageously used. Alternatively, a molding method for flattening the upper surface of the wavelength conversion member 205 using screen printing or a squeeze method may also be an alternative. The wavelength conversion member 205 may be formed to surround a side surface as well as an upper surface of the flip-type LED chip 200.

The reflective member 210 is disposed on the frame 21, forms a cavity accommodating the LED chip 200 therein, and may reflect light emitted from the LED chip 200. The reflective member 210 may be formed to surround the side surface of the LED chip 200, and may be made of a reflective material that reflects light emitted from the LED chip 200.

The reflective member 210, like the reflective member 110 according to an embodiment, has a first side 211 and a second side 212 different from the first side 211, a first height of the first side 211 and a second height of the second side 212 may be different from each other. Here, the light-emitting device package 20 of the present disclosure may radiate light emitted from the LED chip 200 to the upper portion of the LED chip 200, and may also radiate light in a lateral direction through the second side 212 having a different height.

The first side 211 may be formed of a pair of sides facing each other among four sides of the reflective member 210, and the second side 212 may be formed of the remaining pair of sides among the four sides of the reflective member 210. For example, when the light-emitting device package 20 has a structure in which a length in one direction is greater than a length in the other direction as illustrated in the drawing, the first side 211 may be a pair of sides arranged in a long axis direction, and the second side 212 may be a pair of sides arranged in a short axis direction.

An inner surface of the first side 211 may be formed as an inclined surface with constant inclination. The first side 211 may reflect the light emitted from the LED chip 200 to the upper portion of the LED chip 200 through this inclination.

The total height of the second side 212 does not need to be less than the height of the first side 211, and as illustrated in the drawing, a predetermined area of the second side 212 may be less than the height of the first side 211 to form an open area A. In other words, the second side 212 may have the open area A having the second height less than the first height of the first side 211. Through this, the reflective member 210 may expose the light-transmitting member 230 to be described later through the open area A.

The light-transmitting member 230 may be filled inside the cavity to cover the LED chip 200. The light-transmitting member 230 may be made of a transmissive material that transmits light emitted from the LED chip 200. The light-transmitting member 230 may be an organic or inorganic resin material. For example, the reflective member 230 may contain an organic or inorganic resin material such as silicone, epoxy, heat-resistant resin polyimide, phenol resin, melamine resin, unsaturated polyester resin, tritan, and the like.

If the side heights of the reflective member 210 are the same, the light-transmitting member 230 may be formed to have an almost flat surface when filled in the cavity of the reflective member 210. However, in the present disclosure, since the height of the second side 212 of the reflective member 210 is less than the height of the first side 211, the light-transmitting member 230 may have an externally convex curved surface rather than the flat surface. Accordingly, a height of an uppermost end of the light-transmitting member 230 may be formed to be greater than a height of an uppermost end of the reflective member 210.

Figure 9:
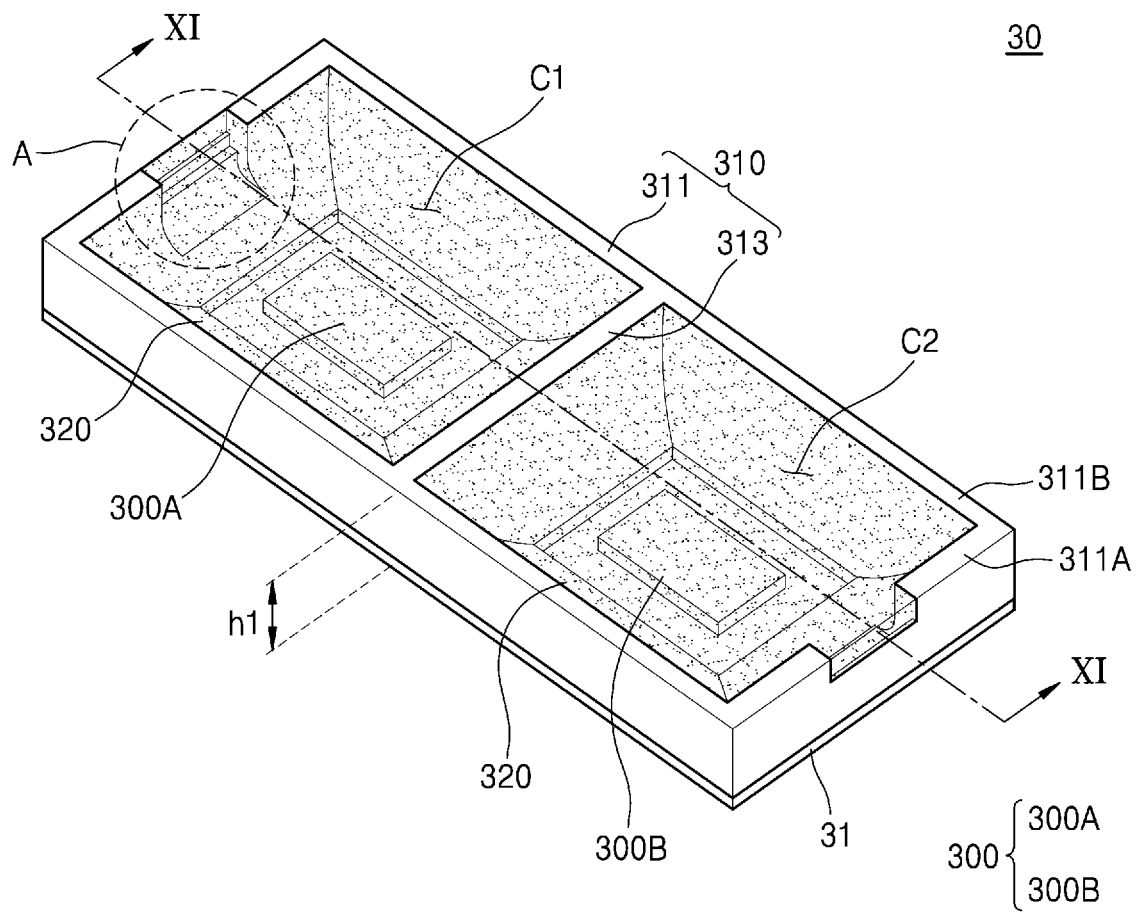
FIG. 9 is a diagram schematically illustrating a light-emitting device package according to another embodiment of the present disclosure.
Figure 10:
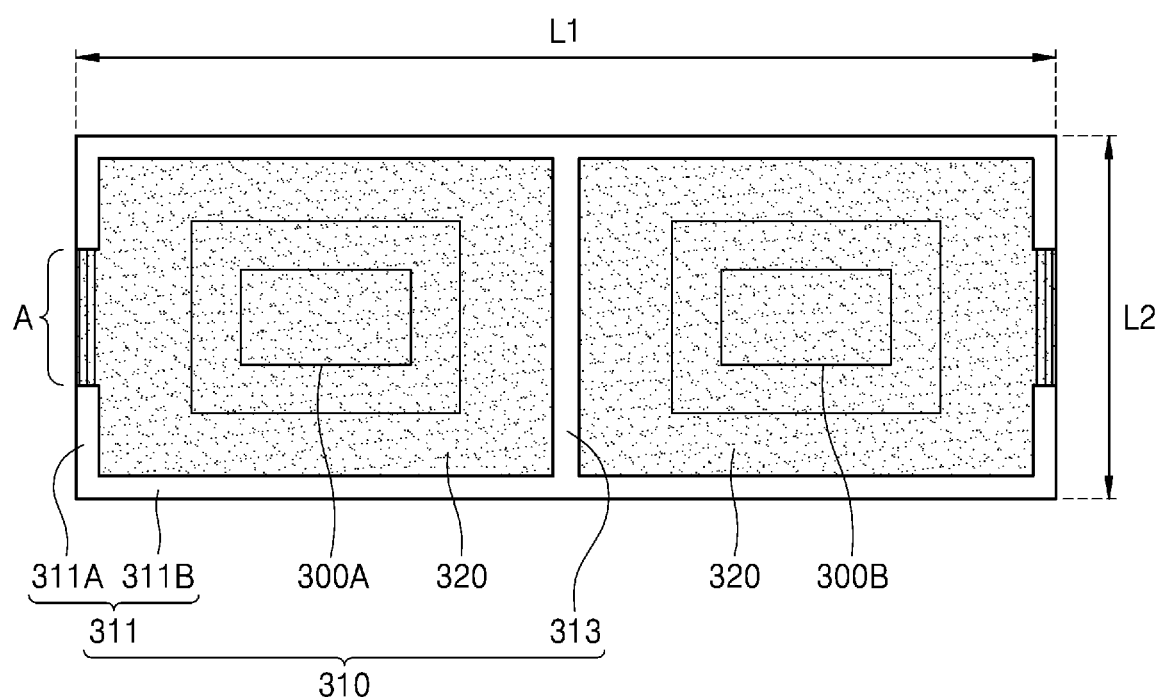
FIG. 10 is a plan view of the light-emitting device package of FIG. 9.
Figure 11:
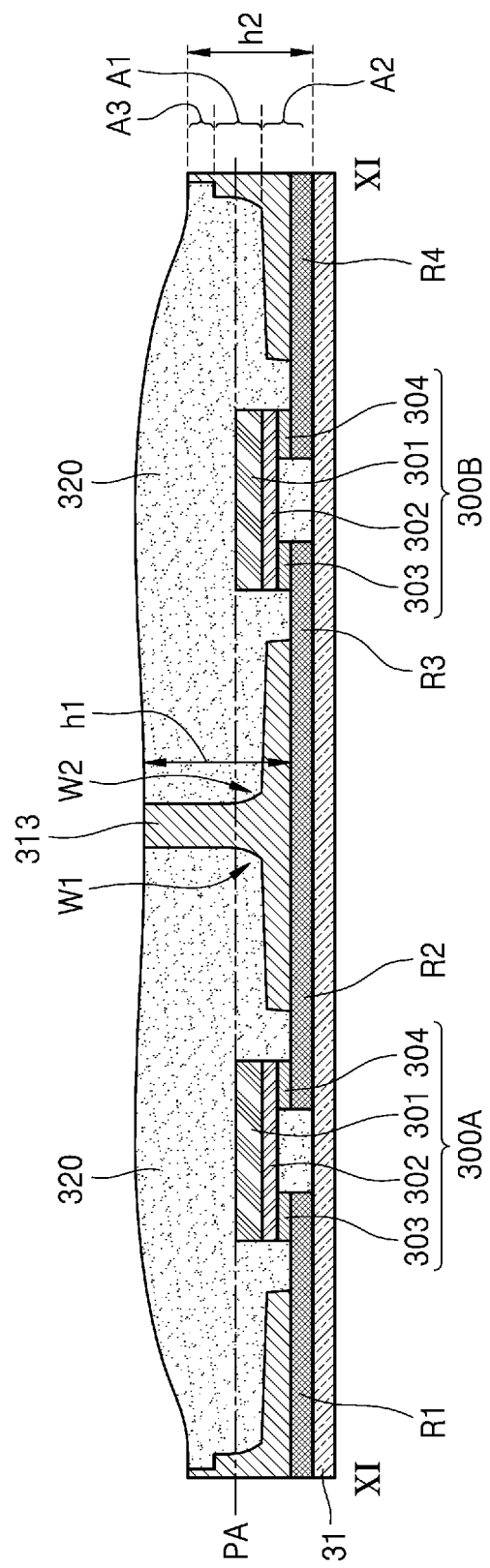
FIG. 11 is a cross-sectional view taken along line XI-XI of FIG. 9.

FIG. 9 is a diagram schematically illustrating a light-emitting device package 30 according to another embodiment of the present disclosure, FIG. 10 is a plan view of the light-emitting device package 30 of FIG. 9, and FIG. 11 is a cross-sectional view taken along line XI-XI of FIG. 9.

Referring to FIGS. 9 to 11, in a light-emitting device package 30 according to another embodiment of the present disclosure, a reflective member 310 has a plurality of cavities corresponding to a plurality of LED chips 300, and hereinafter, for convenience of description, a case in which two cavities C1 and C2 are provided and two LED chips 300A and 300B are mounted will be mainly described. In addition, since the light-emitting device package 30 is the same as or similar to the above-described embodiment except that it includes two cavities C1 and C2, overlapping descriptions will be omitted.

The light-emitting device package 30 according to the present disclosure may include a frame 31, an LED chip 300, a reflective member 310 and a light-transmitting member 320.

The frame 31 may be formed to have a long shape in one direction, and two LED chips 300A and 300B may be mounted along a long axis direction of the frame 31. To this end, two pairs of first electrodes R1 and R3 and second electrodes R2 and R4 may be arranged along the long axis direction in the frame 31. The frame 31 is electrically connected to each of the two LED chips 300A and 300B by the two pairs of first electrodes R1 and R3 and second electrodes R2 and R4, and may be manufactured with material having adequate mechanical strength to support the LED chip 300.

The LED chip 300 may include a substrate 301, a semiconductor laminate structure 302, a first conductive connection pad 303 and a second conductive connection pad 304.

The substrate 301 may be a sapphire substrate having a light-emitting surface, and may be formed of zinc oxide (ZnO), gallium nitride (GaN), silicon carbide (SiC), aluminum nitride (AlN), etc. in addition to sapphire.

The semiconductor laminate structure 302 may be a gallium nitride-based semiconductor laminate structure formed on the substrate 301. The semiconductor laminate structure 302 includes a first conductive semiconductor layer, an active layer and a second conductive semiconductor layer. At this time, although illustrated briefly in the drawings, parts of the second conductive semiconductor layer and the active layer are selectively removed, so that a part of the first conductive semiconductor layer is exposed, and the first conductive connection pad 303 may be connected through an exposed region. Also, the second conductive connection pad 304 is connected to the second conductive semiconductor layer.

The light-emitting device package 30 according to the present disclosure may include the plurality of LED chips 300, and the plurality of LED chips 300 may be two or more. The first conductive connection pad 303 may be electrically connected to the first electrodes R1 and R3, and the second conductive connection pad 304 may be electrically connected to the second electrodes R2 and R4. Although the drawing illustrates that the first electrodes R1 and R3 and the second electrodes R2 and R4 are arranged to intersect along the long axis direction of the frame 31, the present disclosure is not limited thereto, depending on how electrical wirings are connected, the second electrodes R2 and R4 may be disposed in a central region of the frame 31, and the first electrodes R1 and R3 may be disposed in an outer region.

The LED chip 300 may emit at least one of ultraviolet light, blue light, green light, and red light, and may emit light of a short wavelength such as ultraviolet light or blue light.

The reflective member 310 is disposed on the frame 31, and forms two cavities C1 and C2 accommodating two LED chips 300A and 300B therein, respectively, and may reflect light emitted from the two LED chips 300A and 300B. Specifically, the reflective member 310 may include a body 311 disposed on the frame 31 to form an internal space, and a partition wall 313 separating the internal space of the body 311.

The body 311 may be disposed along a periphery of the frame 31 to form the internal space on the frame 31. The body 311 may be made of a reflective material that reflects light emitted from the plurality of LED chips 300. As another embodiment, the body 311 may be made of an absorbing material that absorbs light emitted from the plurality of LED chips 300. Hereinafter, for convenience of explanation, a case where the body 311 is made of the reflective material will be mainly described.

The body 311 may be a structure of a molding resin material having an open top to accommodate the plurality of LED chips 300 in the internal space. In this case, the reflective member 310 may separate the internal space of the body 311 by using the partition wall 313 to form a first cavity C1 and a second cavity C2 accommodating the LED chip 300 therein, respectively. The partition wall 313 may be made of the same material as the body 311, and for example, the body 311 and the partition wall 313 may be integrally manufactured using a single molding.

The reflective member 310 may contain a light reflective material such as titanium oxide, silicon dioxide, titanium dioxide, zirconium dioxide, potassium titanate, alumina, aluminum nitride, boron nitride, mullite, chromium, white-based or metal-based substance in these resins. In addition, the reflective member 310 may further include boron nitride (BN), aluminum nitride (AlN), aluminum (Al), graphite, and the like. Through this, the reflective member 310 may improve heat dissipation performance.

Specifically, the body 311 of the reflective member 310 may include a first side 311A having a first height h1 and a second side 311B having a second height h2, and the second height h2 may be less than the first height h1. The body 311 of the reflective member 310 may expose the light-transmitting member 320 to be described later through the second side 311B formed at a lower level than the first side 311A. Through this, the light-emitting device package 30 of the present disclosure may radiate light emitted from the LED chip 300 to an upper portion of the LED chip 300, and also radiate light in a lateral direction through the second side 311B having a different height.

The first side 311A may be formed of a pair of sides facing each other among four sides of the body 311, and the second side 311B may be formed of the remaining pair of sides among the four sides of the body 311. For example, when the light-emitting device package 30 has a structure in which a length L1 in one direction is greater than a length L2 in the other direction as illustrated in the drawing, the first side 311A may be a pair of sides arranged in a long axis direction, and the second side 311B may be a pair of sides arranged in a short axis direction.

An inner surface of the first side 311A may be formed as an inclined surface with constant inclination. The first side 311A may reflect the light emitted from the LED chip 300 to the upper portion of the LED chip 300 through this inclination.

The total height of the second side 311B does not need to be less than the height of the first side 311A, and as illustrated in the drawing, a predetermined area of the second side 311B may be less than the height of the first side 311A to form an open area A. In other words, the second side 311B may have the open area A having the second height h2 less than the first height h1 of the first side 311A. In this case, the second height h2 may be equal to or less than half of the first height h1. When the open area A is viewed from a side surface of the light-emitting device package 30, a central portion of the second side 311B may be formed in a concave groove structure (see FIG. 2).

An inner surface of the open area A may be formed of a stepped structure of two or more steps. As an embodiment, a portion of the inner surface of the open area A may have a three-step structure including a curved surface. The open area A may effectively reflect the light emitted from the LED chip 300 in the lateral direction through the structure at least partially formed of the curved surface.

Specifically, the open area A of the second side 311B may include a first area A1 having the curved surface, and a second area A2 and a third area A3 connected to both sides of the first area A1. The first area A1 may have the curved surface as described above, and the curved surface may have a parabolic shape profile concave toward an inside of the reflective member 310.

The first area A1 may be disposed on the second area A2 having a predetermined height. Through this, the first area A1 having the curved surface is arranged at a position corresponding to the LED chip 300 having a certain thickness, and an imaginary extension surface PA extending from an upper surface of the LED chip 300 may pass through the first area A1 of the open area A having the curved surface.

Through this structure, the open area A may effectively reflect the light emitted from the LED chip 300 in the lateral direction as well.

The third area A3 may be disposed on the first area A1, and may be formed in a stepped structure having a predetermined height. The light-transmitting member 320 to be described later is a material filled and accommodated in the first cavity C1 and the second cavity C2 of the reflective member 310, and has initial fluidity. The third area A3 may be formed as the stepped structure to prevent the light-transmitting member 320 having this fluidity from overflowing from the second side 311B that is at a lower level than the first side 311A in height.

Meanwhile, the partition wall 313 may separate the internal space formed by the body 311 to form the first cavity C1 and the second cavity C2 accommodating the LED chip 300, respectively. The partition wall 313 may have the same height h1 as the first side 311A of the body 311. However, the present disclosure is not limited thereto, and as another embodiment, the height of the partition wall 313 may have the same height h2 as the open area A of the second side 311B.

The partition wall 313 may include a first side surface W1 and a second side surface W2 that face each other. As an embodiment, each of the first side surface W1 and the second side surface W2 may be formed as an inclined surface having constant inclination, similarly to the inner surface of the first side 311A. In another embodiment, each of the first side surface W1 and the second side surface W2 may be formed of a stepped structure of two or more steps. Specifically, each of the first side surface W1 and the second side surface W2 may be formed of a stepped structure having the same structure as the open area A of the second side 311B.

The light-transmitting member 320 may be filled in the first cavity C1 and the second cavity C2 to cover the LED chip 300. The light-transmitting member 320 may be formed of a light-transmitting resin layer, but is not limited thereto.

The light-transmitting member 320 may be formed by a mixture of at least one phosphor and, for example, an encapsulant made of a resin powder. As an embodiment, when the LED chip 300 is a blue LED chip, the light-transmitting member 320 may include red phosphor excited by blue light to emit red light and green phosphor emitting green light, or may include a yellow phosphor excited by blue light to emit yellow light.

If the side heights of the reflective member 310 are the same, the light-transmitting member 320 may be formed to have an almost flat surface when filled in the cavity of the reflective member 310. However, in the present disclosure, since the height of the second side 311B of the reflective member 310 is less than the height of the first side 311A, the light-transmitting member 320 may have an externally convex curved surface rather than the flat surface. Accordingly, a height of an uppermost end of the light-transmitting member 320 may be formed to be greater than a height of an uppermost end of the reflective member 310.

In one embodiment, the light-transmitting member 320 may be filled with the same light-transmitting material in the first cavity C1 and the second cavity C2, but is not limited thereto, may be filled with materials to which different types of phosphor are added so that different colors of light are emitted. In another embodiment, the light-transmitting member 320 may be filled with a material in which phosphor is added to only one of the first cavity C1 and the second cavity C2, if necessary.

Figure 12:
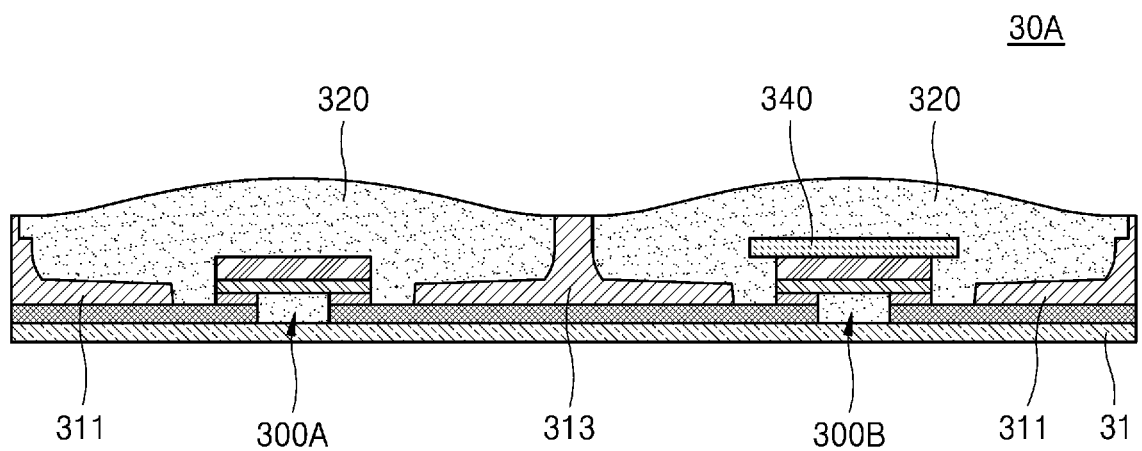
FIGS. 12 to 14 are views for explaining light-emitting device packages according to an optional embodiment of the present disclosure.
Figure 13:
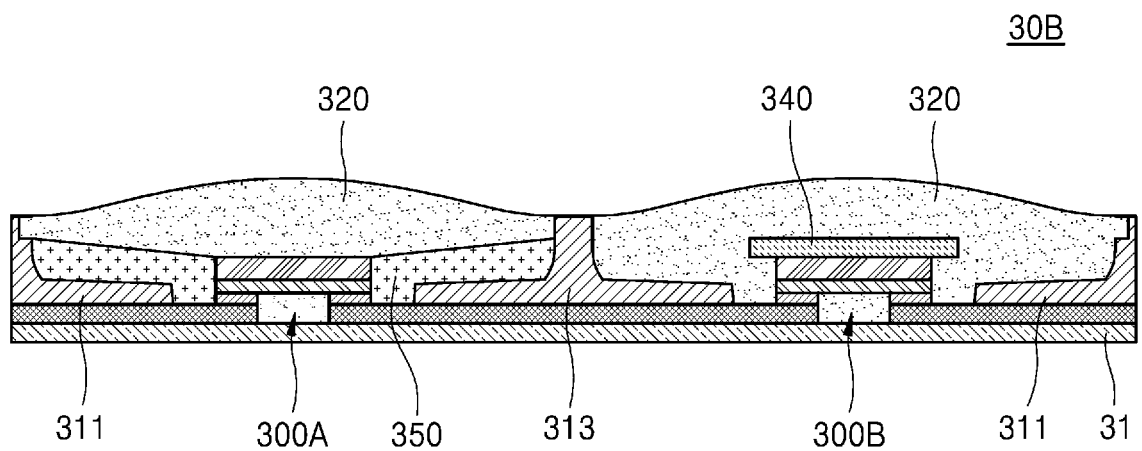
Figure 14:
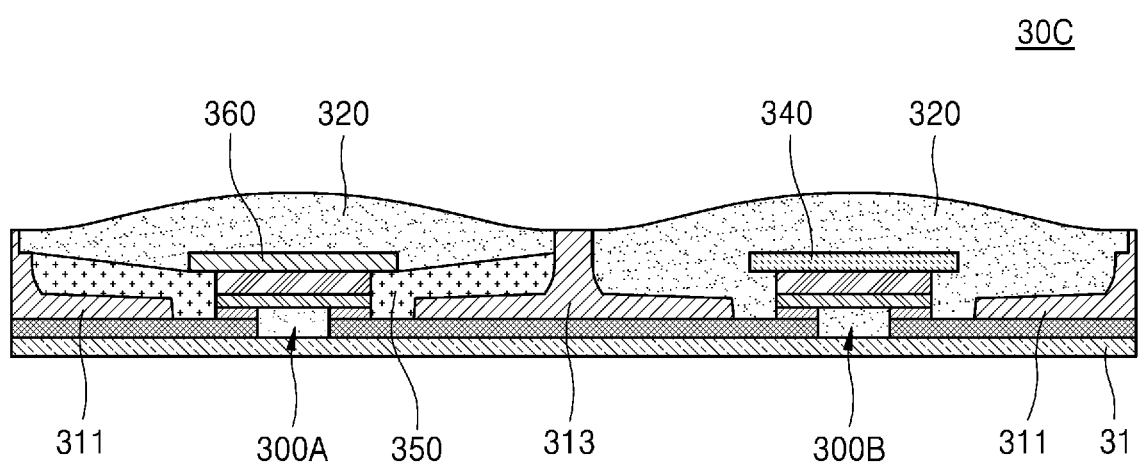

FIGS. 12 to 14 are views for explaining light-emitting device packages 30A, 30B and 30C according to an optional embodiment of the present disclosure.

Referring to FIG. 12, in a light-emitting device package 30A according to an embodiment, phosphor, which is a wavelength conversion material, is not added to the light-transmitting member 320, and a separate wavelength conversion member 340 including phosphor is further included.

The wavelength conversion member 340 is for converting the wavelength of light emitted from the LED chip 300, and may be formed to cover or attach to an upper surface of the LED chip 300. The wavelength conversion member 340 may cover the upper surface of at least one LED chip 300 disposed inside a first cavity C1 and a second cavity C2. In addition, in the wavelength conversion member 340, an outer edge of the wavelength conversion member 340 is preferably formed wider than an outer edge of the LED chip 300, so that wavelength conversion for light reflected by a light reflecting surface of the reflective member 310 is possible.

Although the drawing illustrates the wavelength conversion member 340 in a form of being disposed on the upper surface of the LED chip 300, it may be applied to other appropriate locations located on a light emission path, and the location of the wavelength conversion member 340 may be variously changed according to the structure of the light-emitting device package 30A.

Referring to FIG. 13, a light-emitting device package 30B according to another embodiment may include a sealing member 350 covering a side surface of an LED chip 300. The LED chip 300 may include a silver plating layer, but there is a problem in that the silver plating layer is discolored by exposure to external air. The sealing member 350 covers the side surface of the LED chip 300 to prevent the silver plating layer from being exposed to the outside, thereby preventing discoloration of the silver plating layer and securing reliability.

The sealing member 350 has a certain height and may cover the side surface of the LED chip 300. The sealing member 350 may be accommodated inside a cavity to surround a mounting area of the LED chip 300, and may be formed to extend from the side surface of the LED chip 300 to a reflective member 310.

Like the reflective member 310, the sealing member 350 may contain a light reflective material such as titanium oxide, silicon dioxide, titanium dioxide, zirconium dioxide, potassium titanate, alumina, aluminum nitride, boron nitride, mullite, chromium, white-based or metal-based substance in resins. For example, the sealing member 350 may be a white silicone resin containing titanium oxide (TiO2) in an amount of 5% to 50%. The light-emitting device package 30B according to the present disclosure may prevent thermal deterioration and discoloration of the LED chip 300 by using the sealing member 350, and realize high reliability.

Referring to FIG. 14, a light-emitting device package 30C according to another embodiment may include a diffusion member 360 that changes a direction of light emitted from a light-emitting surface of a LED chip 300 and diffuses it in a lateral direction. The diffusion member 360 may diffuse the light emitted from the LED chip 300 with uniform brightness.

The diffusion member 360 may include a plurality of irregular irregularities on a lower or upper surface. The light incident from the LED chip 300 may be diffused and scattered due to the irregularities. As an embodiment, the diffusion member 360 may be formed of an optically transparent resin such as polyethylene terephthalate (PET), polypropylene (PP), polycarbonate (PC), or polymethyl methacrylate (PMMA). In another embodiment, the diffusion member 360 may include a plurality of scattering particles therein, and the scattering particles may be formed of an acrylic resin, a styrene resin, or the like.

The diffusion member 360 may have a predetermined thickness and may be included in any one of a first cavity 322A and a second cavity 322B, and may uniformly diffuse incident light to form a uniform illuminance. In addition, the diffusion member 360 diffuses the light emitted from the LED chip 300 in a lateral direction, thereby further increasing the amount of light exposed in a lateral direction of the light-emitting device package 30C.

The light-emitting device package according to the embodiments of the present disclosure having the above-described structure forms the open area by lowering a height of a portion of the side, so that the directivity angle to the open area and the amount of light may be increased. Through this, the light-emitting device package may be combined with a secondary optical system such as lenses and reflectors of lighting that requires light distribution in some directions, such as crosswalk light, street light, transmissive light, to secure efficient directional distribution.

The light-emitting device package according to the embodiments of the present disclosure may improve the uniformity of luminance between the light-emitting devices, and may improve stains at an edge portion of the light-emitting device package.

As such, the present disclosure has been described with reference to one embodiment shown in the drawings, but it is merely exemplary, and those skilled in the art will understand that various modifications and variations of the embodiments are possible therefrom. Accordingly, the true technical protection scope of the present disclosure should be determined by the technical spirit of the appended claims.

The light-emitting device package according to embodiments of the present disclosure forms the open area by lowering a height of a portion of the side, thereby increasing the directivity angle and the amount of light to the open area.

The light-emitting device package according to the embodiments of the present disclosure may improve the uniformity of luminance between the light-emitting devices, and may improve stains at an edge portion of the light-emitting device package.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device package comprising:
    a frame comprising one side on which a first electrode is formed and the other side on which a second electrode is formed;
    an LED chip comprising a first conductive connection pad electrically connected to the first electrode and a second conductive connection pad electrically connected to the second electrode;
    a reflective member disposed on the frame, forming a cavity for accommodating the LED chip therein, and reflecting light emitted from the LED chip; and a wavelength conversion member filled in the cavity to cover the LED chip,
wherein the reflective member comprises a first side having a first height and a second side having a second height, and the second height is less than the first height,
wherein the second side comprises an open area exposing the wavelength conversion member, and
wherein an inner surface of the open area has a stepped structure of two or more steps.

2. The light-emitting device package of claim 1, wherein a portion of the inner surface of the open area is formed of a curved surface.

3. The light-emitting device package of claim 2, wherein an imaginary extension surface extending from an upper surface of the LED chip passes through a first area of the open area including the curved surface.

4. The light-emitting device package of claim 1, wherein the second height is equal to or less than half of the first height.

5. The light-emitting device package of claim 1, wherein a length of the first side of the reflective member is greater than a length of the second side thereof.

6. The light-emitting device package of claim 1, wherein an inner surface of the first side comprises an inclined surface having a constant inclination.

7. The light-emitting device package of claim 1, wherein a height of an uppermost end of the wavelength conversion member is greater than a height of an uppermost end of the reflective member.

8. The light-emitting device package of claim 1, wherein an upper surface of the wavelength conversion member is formed as a curved surface.

* * * * *